(12) United States Patent
Chung et al.

(10) Patent No.: US 7,592,649 B2
(45) Date of Patent: Sep. 22, 2009

(54) MEMORY WORD LINES WITH INTERLACED METAL LAYERS

(75) Inventors: Shine Chung, Taipei (TW); Cheng-Hsien Hung, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 12/100,866

(22) Filed: Apr. 10, 2008

(65) Prior Publication Data
US 2009/0166872 A1 Jul. 2, 2009

Related U.S. Application Data

(60) Provisional application No. 61/016,798, filed on Dec. 26, 2007.

(51) Int. Cl.
*H01L 29/00* (2006.01)
(52) U.S. Cl. .............................. 257/208; 257/E27.084; 257/4
(58) Field of Classification Search .................. 257/4, 257/5, 208, 209, 211, 296, 390, 391, E27.084, 257/E27.097, E27.098, E27.102, 758, E23.011, 257/314–316, 698
See application file for complete search history.

(56) References Cited

U.S. PATENT DOCUMENTS

2008/0067554 A1* 3/2008 Jeong et al. ................. 257/211

* cited by examiner

*Primary Examiner*—Davienne Monbleau
*Assistant Examiner*—Shweta Mulcare
(74) *Attorney, Agent, or Firm*—K&L Gates LLP

(57) ABSTRACT

A memory device with improved word line structure is disclosed. The memory device includes a plurality of polysilicon strips substantially parallel to each other on the substrate, the plurality of polysilicon strips arranged in two interleaved groups of a first group and a second group. The memory device further includes a first layer of conductive strips forming a plurality of bit lines and a second layer of meal strips, the second layer of conductive strips overlying the polysilicon strips and coupled to the first group of polysilicon strips. In addition, the memory device includes a third layer of conductive strips forming one or more power line, and a fourth layer of metal strips, the fourth layer of conductive strips overlying the second layer of conductive strips and coupled to the second group of polysilicon strips to form a new word line structure having a low resistance.

23 Claims, 3 Drawing Sheets

MEMORY WORD LINES WITH INTERLACED METAL LAYERS

BACKGROUND OF THE INVENTION

This application claims priority to U.S. Provisional Application No. 61/016,798 filed Dec. 26, 2007. The present invention relates generally to a semiconductor memory device, and more particularly to a memory device with improved word line structure having reduced RC delay time, lower power consumption, and higher device performance.

Word lines of conventional semiconductor memory devices are usually made of polysilicon material, and thus they have relatively high resistivity. One conventional technique to reduce IR drops and RC time delay along the word lines is to electrically couple each of the polysilicon word lines to a corresponding overlying metal strips (usually metal 2 layer). Such conventional technique poses new problems as device feature size further decreases in the sub-65 nm geometry.

One of the new problems includes an abrupt increase of the lateral parasitic capacitance as the metal width becomes less than 1.5 □m, resulting in an increased RC time delay and significant IR drop along the word line and various device performance degradations in the sub-65 nm technology. As illustrated in FIG. 2, RC delay time (Y-axis) increases abruptly as metal width (X-axis) becomes less than 1.5 □m.

Therefore, the present invention recognizes these drawbacks in conventional memory devices and provides an improved word line structure that prevents degradation of RC time delay and other device performance in the sub-65 nm technology nodes.

SUMMARY OF THE INVENTION

In view of the foregoing, embodiments of the present invention provide a memory device with improved word line scheme having lower RC delay time and power consumption, and higher device performance.

According to a first embodiment of the present invention, a memory device with one or more cell array region and peripheral region on a semiconductor substrate is disclosed. The memory device includes a plurality of polysilicon strips substantially parallel to each other forming a plurality of word lines on the cell array region, the plurality of polysilicon strips arranged in two interleaved groups of a first group and a second group. The memory device further includes a first layer of conductive strips substantially parallel to each other forming a plurality of bit lines and a second layer of conductive strips substantially parallel to each other, the second layer of conductive strips overlying and coupled to the first group of polysilicon strips. In addition, the memory device includes a third layer of conductive strips substantially parallel to each other providing one or more power line and a fourth layer of conductive strips substantially parallel to each other, the fourth layer of conductive strips overlying and coupled to the second group of polysilicon strips.

According to a second embodiment of the present invention, a memory device with one or more cell array region and peripheral region on a semiconductor substrate is disclosed. The memory device includes a plurality of polysilicon strips substantially parallel to each other forming a plurality of word lines on the cell array region, the plurality of polysilicon strips arranged in two interleaved groups of a first group and a second group. The memory device further includes a first layer of conductive strips substantially parallel to each other forming a plurality of bit lines and a second layer of conductive strips substantially parallel to each other, the second layer of conductive strips overlying and coupled to the first group of polysilicon strips. In addition, the memory device includes a third layer of conductive strips substantially parallel to each other providing one or more power line and a fourth layer of conductive strips substantially parallel to each other, the fourth layer of conductive strips overlying and coupled to the second group of polysilicon strips, wherein each of the second layer of conductive strips has a minimum width and a predetermined cell pitch, the ratio of the minimum width to the predetermined cell pitch is substantially the same as or higher than 0.8.

The features and advantages described in the specification are not all inclusive, and particularly, many additional features and advantages will be apparent to one of ordinary skill in the art in view of the drawings, specification, and claims hereof. Moreover, it should be noted that the language used in the specification has been principally selected for readability and instructional purposes, and may not have been selected to delineate or circumscribe the inventive subject matter.

The construction and method of operation of the invention, however, together with additional objects and advantages thereof will be best understood from the following description of specific embodiments when read in connection with the accompanying drawings.

BRIEF DESCRIPTION OF THE DRAWINGS

A more complete understanding of the present invention may be described by referring to the detailed description and claims when considered in conjunction with the following figures.

DETAILED DESCRIPTION OF THE INVENTION

The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
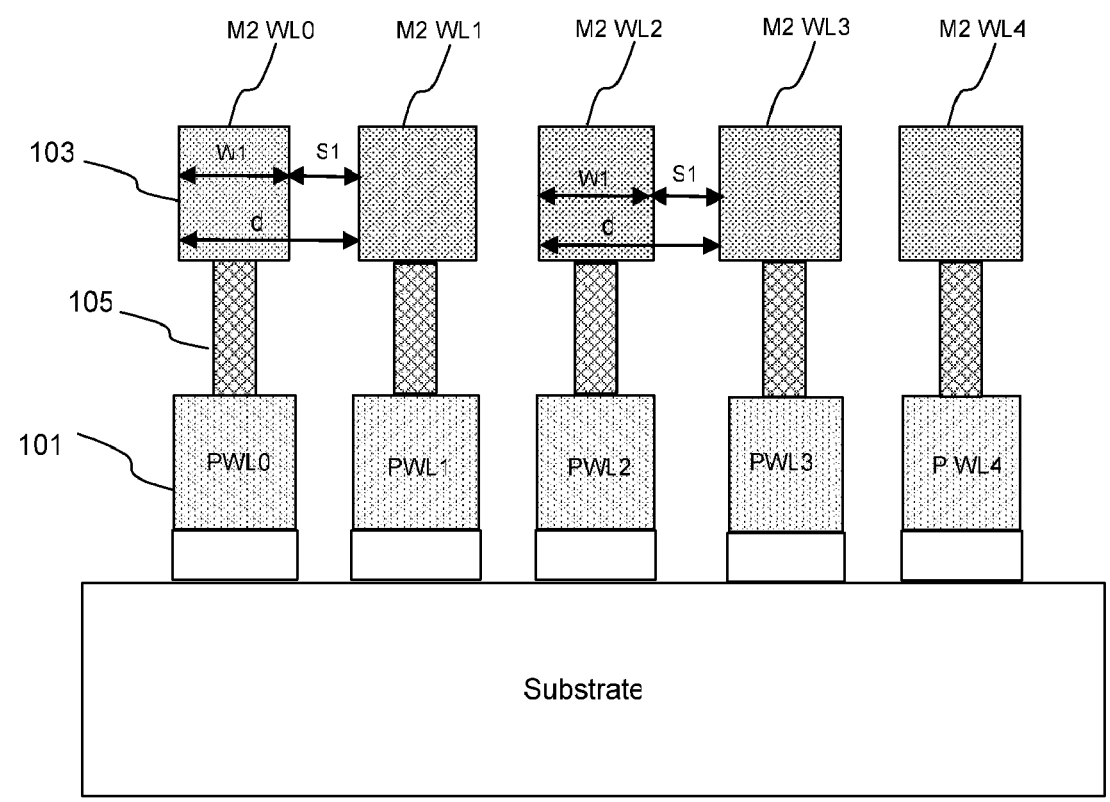
FIG. 1 is a simplified cross-sectional view of the conventional word line structure comprising a plurality of polysilicon strips and a second layer of metal strips coupled to the corresponding underlying polysilicon strips arranged in accordance with a conventional memory device.

FIG. 1 is a simplified cross-sectional view of the conventional word line structure. The structure is that of a classic word line comprising a plurality of polysilicon strips 101 and a layer of overlying conductive strips 103 which are electrically coupled to each other via contacts 105 at every 16, 32 or 64 word lines depending on the given design rules to provide a reduced current-resistance drop (IR drop) and low RC time delay along the word lines.

Referring to FIG. 1, a plurality of polysilicon strips 101 are formed in parallel to each other on one or more dielectric layer (not shown) on a semiconductor substrate. Over the plurality of polysilicon strips 101, there are formed a plurality of conductive strips 103 arranged in parallel to each other. Each of the conductive strips 103 is electrically coupled to each of the polysilicon strips 101 via contacts 105 to provide a plurality of word lines 101/103 having a low resistance.

Although not shown in FIG. 1, there are formed a plurality of bit lines over the semiconductor substrate. Bit lines are arranged orthogonal to the word lines. In one example, bit lines comprise a first layer of metal strips while the conductive strips 103 comprise a second layer of metal strips (metal 2) made of aluminum, tungsten, copper, or combination thereof. Each of the conductive strips 103 including M2 WL0, M2 WL1, M2 WL2, ... M2 WLn (n=0, 1, 2, 3 ...) is coupled to the corresponding underlying polysilicon strips 101 including PWL0, PWL1, ... PWLn (n=0, 1, 2, 3, ...) via contacts 105 to form a low resistance word line structure.

A minimum width and a minimum spacing of the conductive strips 103 are predetermined by the given design rules. In this example, the conductive strips 103 have the minimum width W1 and minimum spacing S1 between two adjacent conductive strips. A "pitch" is also predetermined by the given design rules. The pitch is the distance between the same points of two adjacent structures of the same type, e.g., two adjacent word lines of M2WL0 and M2WL1. In FIG. 1, one cell pitch "d" is defined as the distance between the same points of two adjacent conductive strips 103, or d=W1+S1. In the conventional word line structure as shown in FIG. 1, the ratio of the metal width W1 to the cell pitch (W1+S1) is in the range of 0.5 or less.

As the manufacturing technology for such high density memory devices as dynamic random access memory (DRAM), embedded DRAM (eDRAM), embedded PCRAM, Flash, or MRAM advances into a sub-65 nm geometry, their minimum feature sizes further decrease, causing several performance issues. For example, if a minimum metal width becomes less than 1.5 μm, RC time delay increases abruptly as illustrated in FIG. 2, resulting in degraded speed performance and power consumption and substantial IR drops along the word lines in the memory devices manufactured by the sub-65 nm technology.

Reduced minimum width and spacing of the metal lines in the sub-65 nm technology further cause degradation of Vcc-min (device performance at low supply voltage), increased power consumption, and degradation of speed performance. Since the minimum cell pitch is predetermined by the given design rules, overcoming these problems without increasing the cell pitch is one of the objectives of the present invention.

Figure 2:
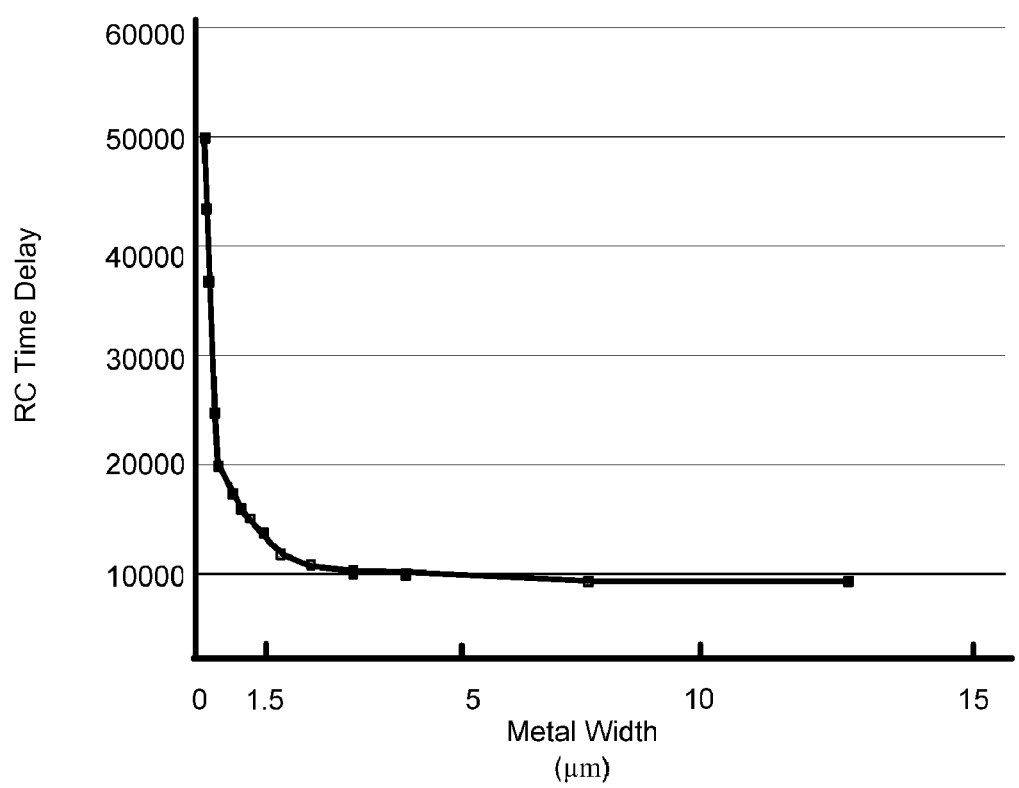
FIG. 2 is a graph showing RC time delay along a width of the conductive strip comprising a word line in a conventional memory device.

FIG. 2 is a graph showing a plot of RC time delay along a metal width of the conductive strips as shown in FIG. 1. Referring to FIG. 2, RC time delay increases abruptly as the metal width W1 (as shown in FIG. 1) becomes less than 1.5 micron. It is noted that as the metal spacing S1 decreases, a lateral coupling capacitance becomes dominant in the sub-65 nm geometry. As described above, because the cell pitch is generally fixed under a given design rule, it is not feasible to increase both the width W1 and spacing S1 of the conductive strips 103 in the conventional word line structure. Desirable in the art is a new word line structure that may solve all the problems addressed above.

Figure 3:
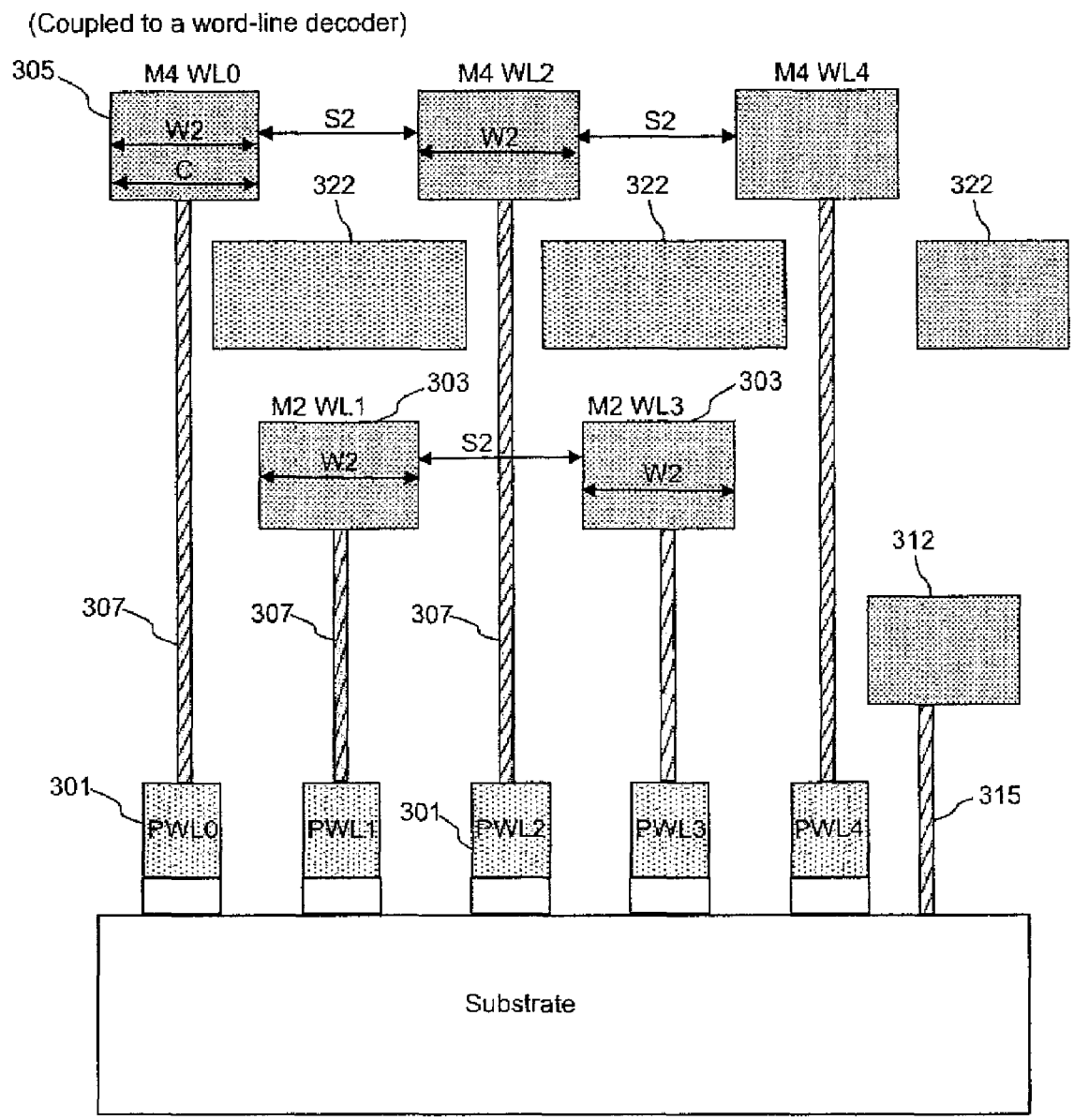
FIG. 3 is a simplified cross-sectional view of a new word line structure comprising a plurality of conductive strips coupled to the underlying polysilicon strips in accordance with an exemplary embodiment of the present invention.

FIG. 3 is a simplified cross-sectional view of the improved word line structure in accordance with an exemplary embodiment of the present invention. In this embodiment, a fourth layer of conductive strips 305 is formed over the second layer of conductive (M2) strips 303 and the polysilicon strips 301 arranged in two interleaved groups of a first group and a second group. The polysilicon strips comprise at least one of doped polysilicon, tungsten silicide, nickel silicide, cobalt silicide, in-situ doped polysilicon material, and combination thereof. As illustrated in FIG. 3, a plurality of bit lines 312 comprising a first layer of conductive (M1) strips are formed in the cell regions in a perpendicular arrangement with respect to the polysilicon strips 301. A third layer of conductive strips 322 is generally used as global bit lines, data signal paths, or power lines in the peripheral region of the memory device. While the conductive strips 305 comprise the fourth layer of conductive (M4) strips. The first, second, third, and fourth layers of conductive strips comprise at least one of aluminum, copper, titanium, tungsten, and combination thereof to provide cell array regions and peripheral regions of an embedded DRAM (eDRAM) device.

The plurality of polysilicon strips 301 is disposed substantially parallel to each other and they are arranged in two interleaved groups of a first group and a second group. A plurality of wordline decoders provided in the peripheral region are used to address the first and second groups of polysilicon strips. Each of the second layer of conductive strips 303 is electrically coupled to each of the first group of polysilicon strips. Specifically, each of the conductive strips 303 including M2 $WL_1$, M2 $WL_3$, ... M2 $WL_{2n+1}$ (n=0, 1, 2 ...) is coupled to the corresponding underlying first group of polysilicon strips including $PWL_1$, $PWL_3$, ... $PWL_{2n+1}$ (n=0, 1, 2 ...) via contacts 307 through one or more dielectric layer (not shown) to form a new word line structure having a low resistance.

The fourth layer of conductive strips 305 is formed substantially parallel to each other over the second layer of conductive strips 303 and the polysilicon strips 301. Each of the fourth layer of conductive strips 305 including M4 $WL_0$, M4 $WL_2$, M4 $WL_4$, ... M4 $WL_{2m}$ (m=0, 1, 2 ...) is coupled to the corresponding second group of polysilicon strips including $PWL_0$, $PWL_2$, $PWL_4$, ... $PWL_{2m}$ (m=0, 1, 2 ...) via contacts 307 to form a new word line structure. The contacts 307 between the conductive strips 303, 305 and the polysilicon strips 301 are typically made at every 16, 32 or 64 word lines subject to the given design rules to reduce resistance of the word lines.

Referring to FIG. 3, each of the conductive strips 303 and 305 has a minimum width W2 and a minimum spacing S2 between adjacent conductive strips on each layer. Each of W2 and S2 is far wider than W1 and S1 as shown in the conventional word line structure illustrated in FIG. 1. The cell pitch "d" in the new word line structure as illustrated here in FIG. 3 is substantially the same as W2. In one embodiment, the width W2 of the conductive strips 303 or 305 is substantially the same as the spacing S2 of the conductive strips 303 or 305, such that the cell pitch "d" becomes substantially the same as the width W2 or space S2.

Referring to FIG. 1, the ratio of metal width W1 to cell pitch (W1+S1) in the conventional word line structure is around 0.5 or less. According to the simulation tests, it is desirable that the metal width W2 be at a minimum of 80% of the cell pitch to avoid degradation of device performance including RC time delay, IR drop, Vccmin, and other related device performance. Likewise, it is desirable that the metal width W2 of the second layer of conductive strips 303 be at least 80% of the cell pitch to avoid degradation of device performance. The ratio of metal width W2 to one cell pitch (where d1=W2) is 1.0 in one embodiment, while the ratio of metal width W2 to another cell pitch (where d2=W2+α) is 0.8 in another embodiment.

Comparison table shown below summarizes the dimensions of the conductive strips used in the simulation tests, sheet resistance (Rs), Total Resistance (Rtotal), total capacitance (C total), and RC time delays obtained by the simulation tests using the word line structures shown in FIGS. 1 and 3, respectively. The same cell pitch is used on both cases.

Comparison Table 1

| Word line structure | Width (um) | Space (um) | Rs (Ohm/Sq) | Length (um) | R total (Ohm) | C total (fF) | RC time delay |
|---|---|---|---|---|---|---|---|
| Conventional | 0.2 | 0.2 | 1.53E−01 | 500 | 383 | 91 | 34,808 |
| Exemplary embodiment | 0.4 | 0.4 | 1.22E−01 | 500 | 153 | 120 | 18,300 |

As demonstrated in the above table, much improved RC time delay value is obtained from the new word line structure disclosed in the embodiments of the present invention due to the doubled width and space of the metal 2 and metal 4 layers. Therefore, the embodiments in the present invention can provide a word line structure that improves performance of the advanced memory devices.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A memory device with one or more cell array region and peripheral region on a semiconductor substrate, comprising:
   a plurality of polysilicon strips substantially parallel to each other forming a plurality of word lines on the cell array region, the plurality of polysilicon strips arranged in a plurality of interleaved groups having a first group and a second group;
   a first layer of conductive strips substantially parallel to each other forming a plurality of bit lines;
   a second layer of conductive strips substantially parallel to each other, the second layer of conductive strips overlying and coupled to the first group of polysilicon strips;
   a third layer of conductive strips substantially parallel to each other, the third layer of conductive strips overlying the second layer of conductive strips and being disposed in the peripheral region of the memory device; and
   a fourth layer of conductive strips substantially parallel to each other, the fourth layer of conductive strips overlying and coupled to the second group of polysilicon strips.

2. The memory device as recited in claim 1, wherein the first and second groups of polysilicon strips comprise at least one of doped polysilicon, tungsten silicide, nickel silicide, cobalt silicide and in-situ doped polysilicon.

3. The memory device as recited in claim 1, wherein the second, third, and fourth layers of conductive strips comprise at least one of aluminum, copper, titanium, tungsten material or a combination thereof.

4. The memory device as recited in claim 1, wherein the third layer of conductive strips provides one or more power lines or signal lines.

5. The memory device as recited in claim 1, wherein each of the plurality of bit lines is disposed generally orthogonal to each of the plurality of word lines.

6. The memory device as recited in claim 1, wherein the third layer of conductive strips is used as data signal paths in the peripheral region of the memory device.

7. The memory device as recited in claim 1, wherein the third layer of conductive strips provides a plurality of global bit lines in the peripheral region of the memory device.

8. The memory device as recited in claim 1, wherein the memory device comprises at least one of an embedded dynamic random access memory (eDRAM), embedded flash memory, embedded PCRAM, and embedded MRAM.

9. The memory device as recited in claim 1, wherein each of the second layer of conductive strips in the cell array region has a minimum width predetermined by a given design rule and a predetermined cell pitch, the ratio of the minimum width to the predetermined cell pitch is substantially greater than 80% of the predetermined cell pitch.

10. The memory device of claim 9 wherein each of the fourth layer of conductive strips in the cell array region has substantially the same minimum width and cell pitch as those of the second layer of conductive strips.

11. A memory device with one or more cell array region and peripheral region on a semiconductor substrate, comprising:
   a plurality of polysilicon strips substantially parallel to each other forming a plurality of word lines on the cell array region, the plurality of polysilicon strips arranged in a plurality of interleaved groups having a first group and a second group;
   a first layer of conductive strips substantially parallel to each other forming a plurality of bit lines;
   a second layer of conductive strips substantially parallel to each other, the second layer of conductive strips overlying and coupled to the first group of polysilicon strips;
   a third layer of conductive strips substantially parallel to each other providing one or more power line; and
   a fourth layer of conductive strips substantially parallel to each other, the fourth layer of conductive strips overlying and coupled to the second group of polysilicon strips, wherein each of the second layer of conductive strips has a minimum width and a predetermined cell pitch, the ratio of the minimum width to the predetermined cell pitch is substantially grater than 0.8.

12. The memory device as recited in claim 11, wherein the first and second groups of polysilicon strips comprise at least one of doped polysilicon, tungsten silicide, nickel silicide, cobalt silicide and in-situ doped polysilicon.

13. The memory device as recited in claim 11, wherein the second, third, and fourth layers of conductive strips comprise at least one of aluminum, copper, titanium, tungsten material, or a combination thereof.

14. The memory device as recited in claim 11, wherein a plurality of wordline decoders are coupled to the first and second groups of polysilicon strips.

15. The memory device as recited in claim 11, wherein the third layer of conductive strips providing one or more power line/signal paths is formed in the peripheral region of the memory device.

16. The memory device as recited in claim 11, wherein the third layer of conductive strips provides a plurality of global bit lines in the peripheral region of the memory device.

17. The memory device as recited in claim 11, wherein the memory device comprises at least one of an embedded dynamic random access memory (eDRAM), embedded flash memory, embedded PCRAM, and embedded MRAM.

18. The memory device as recited in claim 11, wherein the memory device comprises at least one of a dynamic random access memory (DRAM), flash memory, PCRAM, and MRAM.

19. The memory device as recited in claim 11, wherein the fourth layer of conductive strips has a minimum width and a predetermined cell pitch, the ratio of the minimum width to the predetermined cell pitch is substantially the same as 1.0.

20. The memory device as recited in claim 11, wherein the fourth layer of conductive strips has the same minimum width and predetermined cell pitch as those of the second layer of metal strips.

21. A method for forming a memory device with one or more cell array region and peripheral region on a semiconductor substrate, comprising:

forming a plurality of polysilicon strips substantially parallel to each other forming a plurality of word lines on the cell array region, the plurality of polysilicon strips arranged in a plurality of interleaved groups having a first group and a second group;

forming a first layer of conductive strips substantially parallel to each other forming a plurality of bit lines;

forming a second layer of conductive strips substantially parallel to each other, the second layer of conductive strips overlying and coupled to the first group of polysilicon strips;

forming a third layer of conductive strips substantially parallel to each other providing one or more power line; and forming a fourth layer of conductive strips substantially parallel to each other, the fourth layer of conductive strips overlying and coupled to the second group of polysilicon strips.

22. The method of claim 21, wherein each of the second layer of conductive strips in the cell array region has a minimum width and a predetermined cell pitch, the ratio of the minimum width to the predetermined cell pitch is substantially greater than 80% of the predetermined cell pitch.

23. The method of claim 22, wherein the fourth layer of conductive strips has the same minimum width and predetermined cell pitch as those of the second layer of metal strips.

* * * * *